United States Patent
Menon

(10) Patent No.: US 9,454,086 B2
(45) Date of Patent: Sep. 27, 2016

(54) PROGRAMMABLE PHOTOLITHOGRAPHY

(71) Applicant: University of Utah Research Foundation, Salt Lake City, UT (US)

(72) Inventor: Rajesh Menon, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 242 days.

(21) Appl. No.: 14/351,465

(22) PCT Filed: Oct. 15, 2012

(86) PCT No.: PCT/US2012/060270
§ 371 (c)(1),
(2) Date: Apr. 11, 2014

(87) PCT Pub. No.: WO2013/056238
PCT Pub. Date: Apr. 18, 2013

(65) Prior Publication Data
US 2014/0300877 A1    Oct. 9, 2014

Related U.S. Application Data

(60) Provisional application No. 61/627,603, filed on Oct. 14, 2011.

(51) Int. Cl.
*G03F 7/20* (2006.01)
*H01L 21/027* (2006.01)

(52) U.S. Cl.
CPC ......... *G03F 7/70291* (2013.01); *G03F 7/2051* (2013.01); *G03F 7/70* (2013.01); *G03F 7/7035* (2013.01); *H01L 21/027* (2013.01)

(58) Field of Classification Search
CPC ............ G03F 7/70291; G03F 7/7035; G03F 7/70275; G03F 7/70425; G03F 7/70408; G03F 7/70208; G03F 7/2051; G02B 5/003; H01L 21/027
See application file for complete search history.

(56) References Cited

U.S. PATENT DOCUMENTS

| 4,025,191 A | 5/1977 | Seward, III |
| 4,334,003 A | 6/1982 | Jones |

(Continued)

FOREIGN PATENT DOCUMENTS

| GB | 2431732 A | 5/2007 |
| JP | 2005/292323 A | 10/2005 |

(Continued)

OTHER PUBLICATIONS

Menon et al., Absorbance-Modulation optical lithography, J. Opt. Soc. Am. A, vol. 23, No. 9, Sep. 2006, pp. 2290-2294.*

(Continued)

*Primary Examiner* — Steven H Whitesell Gordon
(74) *Attorney, Agent, or Firm* — Thorpe North & Western, LLP

(57) ABSTRACT

A method of programmable photolithography includes positioning (910) a programmable photomask in proximity to a photoresist layer on a sample. The programmable photomask is illuminated (920) with a plurality of different wavelengths of light simultaneously to expose the photoresist layer in a predetermined pattern. The programmable photomask is separated (930) from the photoresist layer and the photoresist layer is developed (940) to create the predetermined pattern in the photoresist layer.

20 Claims, 10 Drawing Sheets

(56) References Cited

U.S. PATENT DOCUMENTS

| | | | |
|---|---|---|---|
| 4,578,344 A * | 3/1986 | Griffing | G03F 7/091 430/156 |
| 4,663,275 A * | 5/1987 | West | G03F 7/091 430/156 |
| 4,816,380 A * | 3/1989 | Covington | G03F 7/091 430/193 |
| 5,062,693 A | 11/1991 | Beratan et al. | |
| 7,510,818 B2 | 3/2009 | Chen et al. | |
| 7,666,580 B2 | 2/2010 | Menon et al. | |
| 7,667,819 B2 | 2/2010 | Menon et al. | |
| 7,713,684 B2 | 5/2010 | Menon et al. | |
| 7,714,988 B2 | 5/2010 | Menon et al. | |
| 7,724,416 B2 | 5/2010 | Miller | |
| 7,736,825 B2 | 6/2010 | Sewell | |
| 7,879,538 B2 | 2/2011 | Wang | |
| 7,989,151 B2 | 8/2011 | Menon | |
| 8,216,765 B2 | 7/2012 | Morimitsu et al. | |
| 2003/0179277 A1 | 9/2003 | Stadler et al. | |
| 2004/0043328 A1 * | 3/2004 | Lu | G03F 7/38 430/311 |
| 2006/0183059 A1 * | 8/2006 | Menon | G03F 7/203 430/322 |
| 2006/0251972 A1 | 11/2006 | Lee | |
| 2006/0286482 A1 * | 12/2006 | Sewell | G03F 7/70958 430/270.1 |
| 2007/0154850 A1 | 7/2007 | Menon | |
| 2008/0318153 A1 * | 12/2008 | Pforr | G03F 1/144 430/270.1 |
| 2009/0170024 A1 * | 7/2009 | Hennig | G03F 7/70633 430/270.1 |
| 2009/0253072 A1 | 10/2009 | Petruska et al. | |
| 2010/0097703 A1 | 4/2010 | Menon et al. | |
| 2010/0248159 A1 * | 9/2010 | Menon | G03B 27/00 430/322 |
| 2011/0090480 A1 | 4/2011 | Lai et al. | |

FOREIGN PATENT DOCUMENTS

| KR | 2007/0072097 A | 6/2006 |
|---|---|---|
| WO | WO 2005/031460 A2 | 4/2005 |
| WO | WO 2006/088643 A2 | 8/2006 |

OTHER PUBLICATIONS

Menon et al.; "Design of diffractive lenses that generate optical nulls without phase singularities;" J. Opt. Soc. Am. A; vol. 26, No. 2; 2009; p. 297.

Tsai et al.; "Reduction of focal-spot size using dichromats in absorbance modulation;" Opt. Let.; vol. 33, No. 24; p. 2916; 2008.

Andrew et al. "Confining light to deep sub-wavelength dimensions to enable optical nanopatterning;" Science, vol. 324, pp. 917 (2009).

* cited by examiner

PROGRAMMABLE PHOTOLITHOGRAPHY

RELATED APPLICATION

This application claims the benefit of U.S. Provisional Patent Application No. 61/627,603, filed Oct. 14, 2011 which is incorporated herein by reference.

BACKGROUND

Lithography is a technology that has facilitated an increase in functionality of devices and improved yield while reducing size, failure rate, and cost. Improvements in lithographic technologies have led to increasingly smaller scale devices, circuits, and features.

Contact-mask photolithography is another technology for fabricating microstructures and is commonly used, for example, in custom manufacturing of RF (Radio Frequency) devices, compound semiconductors, and so forth. In contact-mask photolithography a desired pattern is created on a mask (also referred to as a photomask) as patterns in a metal film. The patterns on the metal film can be created in various ways, such as using laser direct-write systems or scanning-electron-beam-lithography systems.

A conventional contact-mask photolithography process is illustrated in FIG. 1a-1d. In contact-mask photolithography, the mask 110 is brought into contact with a substrate 120 overcoated with photoresist. When the mask and the substrate are illuminated with light 130 from an appropriate light source, such as an ultra-violet wavelength light emitting source, the metal regions on the mask block the light from reaching the underlying photoresist. The light passes through regions of the mask that do not have metal (due to the patterning described above) and exposes the underlying photoresist layer. After exposure, the mask is removed from the substrate and the photoresist on the substrate is developed. In other words, the regions of the photoresist that were exposed to light can be removed, such as by a solvent. Regions 125 not exposed to the light can remain. This process is referred to as a positive-tone photoresist process. In an alternate negative-tone photoresist process, the regions that were exposed to light remain while a solvent removes the regions that were not exposed to the light.

Contact-mask photolithography technologies have been in use for a number of years. However, the technology has drawbacks. Some challenges associated with contact-mask photolithography are the fabrication of the template and durability of the mask. High resolution mask patterning is commonly performed with electron beam lithography or focused ion beam patterning. However, at smaller resolutions the throughput for these techniques can be very low. For example, an electron beam lithography method can take a significant amount of time to cover a 15 cm diameter substrate with a dense pattern of 10 nm features. If the desired pattern is altered, a new mask is made. While experimenting with new devices, alteration of the design may not be uncommon or infrequent. This expensive and time-consuming process patterning process may thus be a disadvantage for prototyping as well as for low-volume production of devices.

Optical patterning of masks has been demonstrated, but conventional photolithography is limited in resolution to relatively large features (i.e. generally greater than approximately 100-200 nm (i.e., ~1-2 micron) feature sizes). Wear of the mask can also be a significant concern. Creation of the masks can thus be slow, difficult and expensive. However, a mask, once created, can be used repeatedly for a large number of substrates, thus offsetting the time and expense in creating the mask.

Creating sub-micron features on a mask while achieving a good contact for transfer of sub-micron features onto a photoresist layer can therefore be challenging.

SUMMARY

A method of programmable photolithography in accordance with an example of the present technology can include positioning a programmable photomask in proximity to a photoresist layer on a sample. The programmable photomask can be illuminated with a plurality of different wavelengths of light simultaneously to expose the photoresist layer in a predetermined pattern. The programmable photomask can be separated from the photoresist layer and the photoresist layer can be developed to create the predetermined pattern in the photoresist layer.

A programmable photolithography system in accordance with an example of the present technology includes a sample stage configured to support a sample. An absorbance modulation layer can be supported over the sample stage. The system can include a first light source configured to direct light of a first wavelength toward the absorbance modulation layer. The system can further include a second light source configured to direct light of a second wavelength toward the absorbance modulation layer simultaneously with the first wavelength of light from the first light source.

A method of programmable photolithography can include positioning a programmable photomask in contact with a photoresist layer on a sample. The programmable photomask can be illuminated with a plurality of different wavelengths of light simultaneously to expose the photoresist layer in a predetermined pattern.

DETAILED DESCRIPTION

Figure 1A:
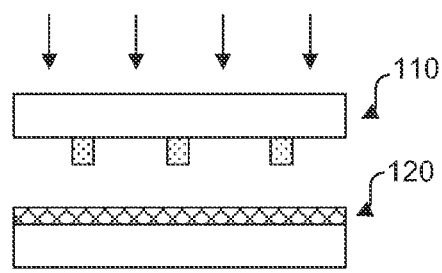
FIGS. 1a-1d illustrate a conventional contact mask photolithography process.
Figure 1B:
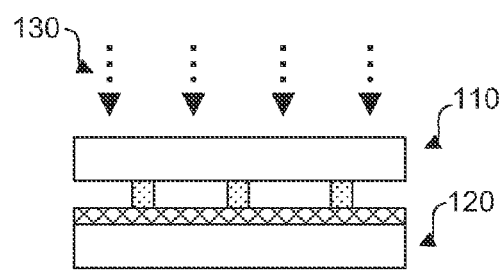
Figure 1C:
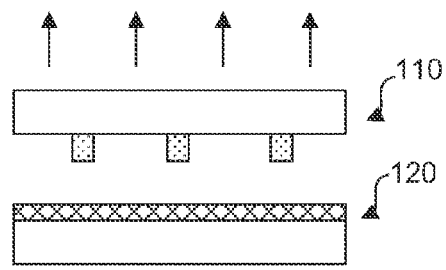
Figure 1D:
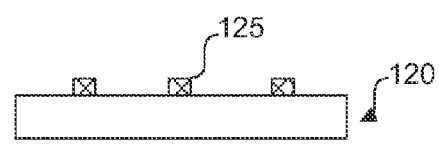

Reference will now be made to the exemplary embodiments illustrated, and specific language will be used herein to describe the same. It will nevertheless be understood that no limitation of the scope of the technology is thereby intended. Additional features and advantages of the technology will be apparent from the detailed description which follows, taken in conjunction with the accompanying drawings, which together illustrate, by way of example, features of the technology.

DEFINITIONS

As used herein, the terms "light" and "electromagnetic radiation" can be used interchangeably and can refer to light or electromagnetic radiation in the ultraviolet, visible, near infrared and infrared spectra. The terms can further more broadly include electromagnetic radiation such as radio waves, microwaves, x-rays, and gamma rays. Thus, the term "light" is not limited to electromagnetic radiation in the visible spectrum. As used herein, a "substrate" can refer to any of a variety of materials, layers, etc. For example, in terms of a semiconductor, the "substrate" can refer to a silicon wafer, or can refer to any of a variety of dielectric, conductive, or other layers in the semiconductor. Other materials can be used as a substrate as well. For example, an absorbance modulation layer can be supported by a substrate of almost any material having sufficient mechanical integrity to preserve a template during use. In some cases, the substrate can be rigid. However, flexible substrates can also be used. For purposes of this disclosure, the substrate can generically refer to a layer or material capable of supporting another layer or material thereon.

It is noted that, as used in this specification and the appended claims, the singular forms "a," "an," and "the" include plural referents unless the context clearly dictates otherwise. Thus, for example, reference to "a layer" includes one or more of such features, reference to "an emitter" includes reference to one or more of such devices, and reference to "pressing" includes reference to one or more of such steps.

As used herein, the terms "about" and "approximately" are used to provide flexibility, such as to indicate, for example, that a given value in a numerical range endpoint may be "a little above" or "a little below" the endpoint. The degree of flexibility for a particular variable can be readily determined by one skilled in the art based on the context.

As used herein, the term "substantially" refers to the complete or nearly complete extent or degree of an action, characteristic, property, state, structure, item, or result. The exact allowable degree of deviation from absolute completeness may in some cases depend on the specific context. However, the nearness of completion will generally be so as to have the same overall result as if absolute and total completion were obtained. The use of "substantially" is equally applicable when used in a negative connotation to refer to the complete or near complete lack of an action, characteristic, property, state, structure, item, or result.

As used herein, a plurality of components may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

EXAMPLES OF THE TECHNOLOGY

Reference will now be made to the exemplary embodiments illustrated, and specific language will be used herein to describe the same. It will nevertheless be understood that no limitation of the scope of the technology is thereby intended. Additional features and advantages of the technology will be apparent from the detailed description which follows, taken in conjunction with the accompanying drawings, which together illustrate, by way of example, features of the technology.

With the general examples set forth in the Summary above, it is noted in the present disclosure that when describing the system, or the related devices or methods, individual or separate descriptions are considered applicable to one other, whether or not explicitly discussed in the context of a particular example or embodiment. For example, in discussing a device per se, other device, system, and/or method embodiments are also included in such discussions, and vice versa.

Furthermore, various modifications and combinations can be derived from the present disclosure and illustrations, and as such, the following figures should not be considered limiting.

The present technology provides systems and methods for programmable photolithography. In one example, a method may include positioning a programmable photomask in contact with a photoresist layer on a sample and illuminating the photomask with a plurality of different wavelengths of light simultaneously to expose the photoresist layer in a predetermined pattern. After separating the photomask from the photoresist layer, the photoresist layer can be developed to create the predetermined pattern in the photoresist layer.

Figure 2A:
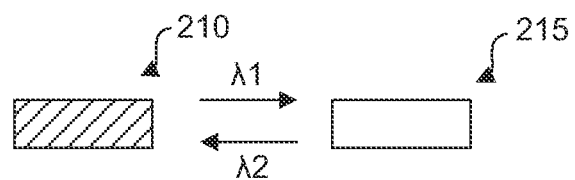
FIG. 2a illustrates an example of a photochromic material for use with absorbance modulation based programmable photolithography in accordance with an example of the present technology.

The present technology utilizes a phenomenon known as absorbance modulation. Absorbance modulation is a phenomenon in which materials change absorption upon exposure to different wavelengths of light. When a film of a suitable material for utilizing this phenomenon, which material is referred to herein as an absorbance-modulation layer or AML, is exposed to a particular wavelength of light (λ1) or range of wavelengths of light, an opaque AML can become transparent. When the now transparent AML is exposed to a different wavelength of light (λ2), the AML can return to the opaque state. FIG. 2a is an illustration representing the absorbance change in a material from opaque 210 to transparent 215 or vice versa using absorbance modulation incurred by incident wavelengths of light λ1 and λ2, respectively. Transparency and opacity are referenced with respect to the incident light. Specific materials can be either transparent or opaque to different wavelengths of light. Furthermore, as used herein, transparency is meant to cover translucency where at least a portion of incident light at a given frequency is allowed to pass through.

Absorbance modulation can refer to a reversible absorbance spectra change induced by the irradiation of a material by light. Absorbance modulation may also have additional effects on materials in addition to the change in color or transparency. For example, absorbance modulation may affect refractive index, metal ion capture, electron capture, shape and size of polymers or solids and other bulk material properties. A variety of different materials may be used for absorbance modulation. Some factors in considering specific absorbance modulation materials include reversibility, absorbance contrast, modulation times, stability, and responsive wavelengths. Absorbance contrast can be sufficiently high to allow discrimination in exposure of underlying photoresist. Although useful contrast ratios can vary, typically ratios above about 3 and in some cases about 4 or above can be suitable. Contrast can be a function of the specific absorbance modulation material, as well as concentration of such materials within carrier materials such as plasticizers and/or polymer matrix (e.g. PMMA, PVP, etc.). Modulation times primarily affect photomask production times rather than actual exposure and patterning times. However, faster modulation times can increase photomask production rates. Typically, opacity transitions are between two isomeric states of a photochromic molecule such as cis versus trans configurations. Some non-limiting examples of classes of molecules for absorbance modulation include spiropyrans (including spirothiopyrans), chromenes, fulgides, azobenzenes, diarylethene, and viologens. Viologens transition via radical production which is different from isomerization processes. Spiropyrans exhibit transitions via ring opening mechanisms. Specific example of suitable absorbance modulation materials can include polymers having azobenzene side-chains, furylfulgides, pyrrolfulgides, and the like. Specific photochromic polymers can include, but are not limited to,

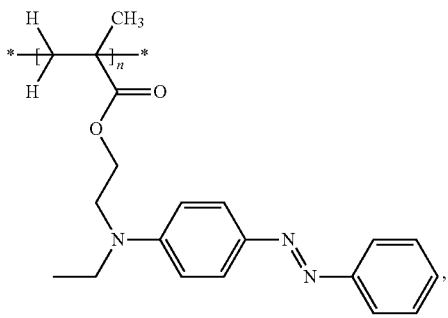

,

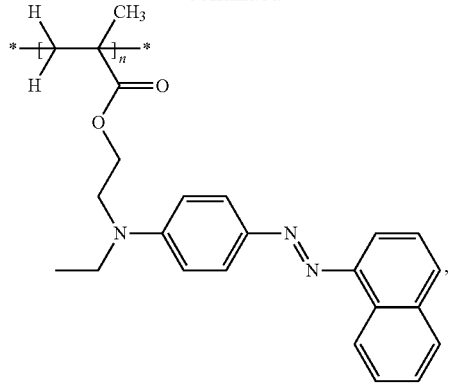

, nitro derivatives thereof such as poly[(4-nitrophenyl)[4-[[2-(methacryloyoxy)ethyl]ethylamino]phenyl]diazene] and poly[(4-nitronaphthyl)[4-[[2-(methacryloyoxy)ethyl]ethylamino]phenyl]diazene],

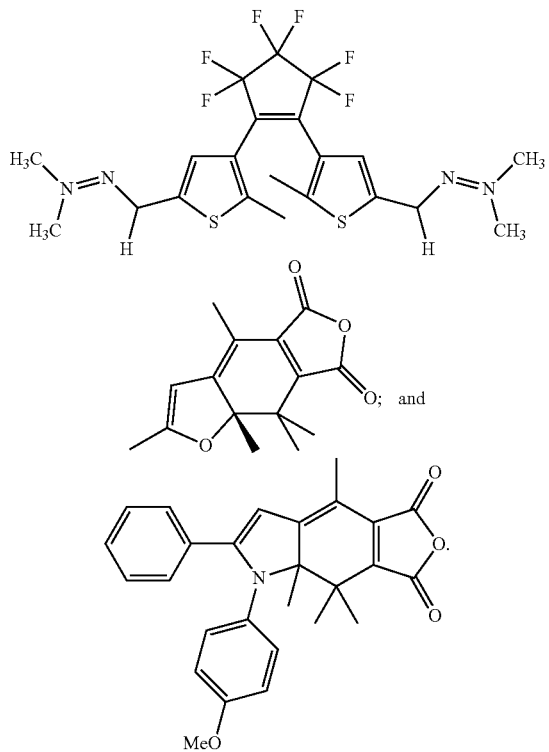

Despite enumeration of several specific absorbance modulation materials, other photochromic materials can be used which exhibit the criteria set forth herein. For purposes of contact-mask lithography it may be desirable to select a material for the AML that is capable of providing significant differentiation between opaque and transparent regions, meaning that materials with larger absorbance changes are desirable.

Absorbance modulation optical lithography (AMOL) involves the use of an AML that has a reversible transition between transparent and opaque states. During the AMOL patterning process, an equilibrium state is reached where a particular absorbance pattern has formed in the AML. There is not a material change in this layer, but rather an isomerization of the molecules in the layer.

Figure 2B:
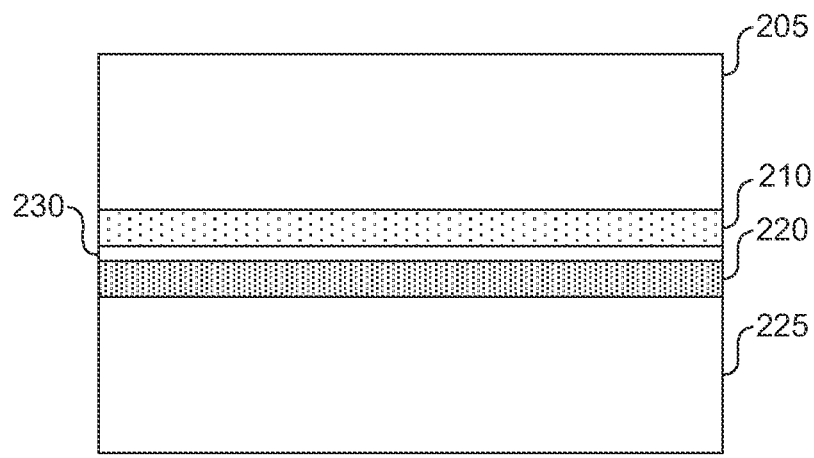
FIG. 2b is a block diagram of a system for programmable photolithography in accordance with an example of the present technology.

Referring to FIG. 2b, a block diagram of a programmable-contact mask and sample are illustrated in accordance with an example of the present technology. The programmable mask may include a transparent substrate 205 (such as quartz or fused silica or glass, for example) coated with a film 210 of the AML material. For the present programmable mask contact lithography technology, the programmable mask can be placed in close proximity to a substrate 225 which is overcoated with a photoresist layer 220. In one example, the programmable mask can be placed in contact with the photoresist layer on the substrate, as illustrated in FIG. 2b. The film 210 can have a thickness which allows production and exposure of desired feature sizes within the photoresist layer 220. As a general guideline the film thickness can range from about 20 nm to about 600 nm, however other thicknesses can be suitable depending on the target feature sizes. The AML can be coated onto a suitable mask substrate such as a photomask blank. Coating can be accomplished using any suitable method including, but not limited to, spin casting, sputtering, drop casting or the like.

A barrier layer 230 may optionally be on the AML 210 on an opposite side from the transparent substrate 205 and may be a part of the programmable mask. In examples including a barrier layer, the barrier layer may directly contact the photoresist layer. In examples excluding the barrier layer, the AML may directly contact the photoresist layer. Use of the barrier layer can prevent potential material transfer from the AML to the photoresist. For example, the barrier layer may be used to prevent sticking of the AML to the photoresist. The barrier layer may serve as a protective layer for protecting the AML from environmental damage (such as during storage, for example) or from the photoresist. The barrier layer may also serve to protect the photoresist layer from the AML. The barrier layer may be thin compared to the wavelength of the exposing light. For example, barrier layers can often range from about 1 nm to about 50 nm. Providing a relatively thin barrier layer may avoid negative implications on achievable lithography resolution which may otherwise occur due to diffraction of the light passing through the barrier layer to the photoresist layer. The material for the barrier layer may be selected to absorb minimal light from the wavelengths of interest in modifying absorbance of the AML.

The barrier layer 230 may be composed of any of a variety of suitable materials. Some non-limiting example materials include organic polymers such as polyvinyl alcohol, polyvinyl acetate, polymethylmethacrylate, spin-on-glass and so forth. Other non-limiting example materials can include metals such as chromium, silver, gold, tungsten, and so forth; or other non-metal materials such as silicon-dioxide, silicon, fused silica, quartz, and so forth. Spin casting, drop casting, dip casting, evaporation, thermal deposition, chemical-vapor deposition, sputtering and so forth are techniques that may allow for a uniform film quality and thickness in deposition of the barrier layer across the entire surface area of the AML 210. The AML may preferably be formed to provide a flat, defect-free surface for application of the barrier layer.

Reference will now be made to FIGS. 3a-3e. The programmable photomask may be comprised of a photomask blank 320 that is overcoated with a thin layer of the photochromic AML 315. The photomask blank may be a substrate that is highly transparent to the illumination wavelength and may be optically flat on at least two surfaces including the surface on which the AML is formed and an opposite surface upon which light for modulation absorbance of the AML is incident. In examples where two wavelengths are used to modulate the AML absorbance, the photomask blank may be highly transmissive to both wavelengths. Such a material may include, for example, fused silica, fused quartz, quartz, silicon dioxide, glass and so forth. It is noted that while the examples described herein refer primarily to programmable photolithography using two wavelengths of light for absorbance modulation, any other suitable number of wavelengths of light may be used to implement systems and methods in accordance with the principles described herein. For example, an implementation utilizing a third wavelength of light will be described later.

Anti-reflection coatings may be used on a top surface of the photomask blank to reduce the amount of light lost by reflection from the top surface. The AML 315 may be deposited onto the photomask blank 320 by spin casting, drop casting, dip-casting, evaporation, sputtering, chemical-vapor deposition, or any other suitable technique that can result in a uniform film thickness and homogeneous film composition over the entire surface area.

The sample can include any support substrate 305 that is coated with a photosensitive material (i.e., photoresist 310). The support substrate may, for example, be formed of silicon, silicon oxide, glass, quartz, gallium arsenide (GaAs), or any other suitable rigid, optically flat substrate. Precautions may be taken to avoid dust particles in order to allow for intimate contact of the photomask with the substrate. Such intimate contact can also be achieved by allowing either the photomask or the sample to conform to the surface geometry of the other of the photomask and the sample, such as in examples where either the photomask or the sample (or both) is relatively flexible. An example flexible substrate may be a thin silicon wafer.

The photosensitive material used may be a photoresist 310 that undergoes a chemical reaction when exposed to a wavelength of light. Any type of photoresist can be used. Chemically amplified photoresists allow for shorter exposure times due to higher sensitivity but may also suffer from acid diffusion, which can affect the quality of the printed features. Although only a single layer of photoresist is shown in the FIGS. 3a-3e, it will be appreciated that samples for lithography may involve a multi-layer stack including adhesion layers, pattern-transfer layers, antireflection coatings, and photoresist layers. The illustration in FIG. 3a-3e is not intended to be limiting of the nature, structure, or organization of the samples in any way. The single photoresist layer is used in the illustration for simplicity.

Figure 3A:
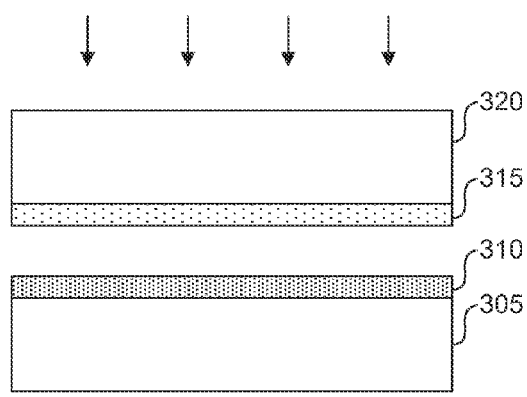
FIGS. 3a-3e illustrate a process for programmable photolithography in accordance with an example of the present technology.

An example process for programmable contact mask photolithography will now be described with continued reference to FIGS. 3a-3e, beginning with specific reference to FIG. 3a. A programmable photomask is prepared by forming an AML 315 on a substrate 320, such as quartz. Similarly, a sample is prepared by forming a photoresist layer 310 on a substrate 305, such as silicon. The programmable photomask may be brought into intimate contact with the sample. For example, the programmable photomask may be brought into intimate contact with the sample by pulling a vacuum in an enclosed chamber to evacuate air from the gap between the mask and the sample. As another example, pressure may be applied to the mask and/or the sample to bring the mask in contact with the sample.

Figure 3B:
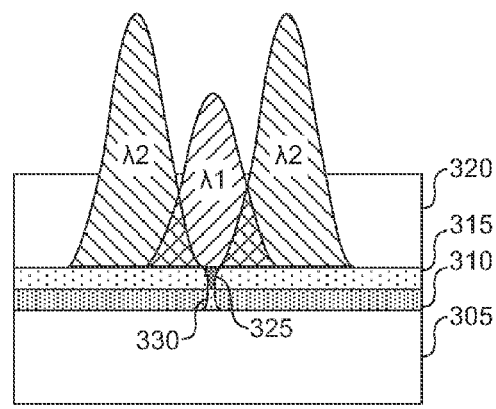

After bringing the mask and sample into proximity or into contact with one another, the programmable mask may be illuminated by a plurality of wavelengths of light, as shown in FIG. 3b. For example, the programmable mask may be substantially simultaneously illuminated by a focused spot of light at a first wavelength $\lambda 1$ and a focused ring of light at a second wavelength $\lambda 2$. Referring to FIG. 3b, a crosssectional side-view of the illumination is illustrated showing the second wavelength $\lambda 2$ on either side of the first wavelength $\lambda 1$. However, from a top view, the light of the second wavelength $\lambda 2$ in this example may circumscribe the light of the first wavelength $\lambda 1$ in a circular or ring-like shape.

Due to absorbance modulation, light of the first wavelength $\lambda 1$ can be tightly confined in space, resulting in a small region of the photoresist being exposed, as indicated by the latent image 330. In some examples, the light of the first and second wavelengths may at least partially overlap. Impingement of the light of the second wavelength $\lambda 2$ on a same portion of the AML 315 as a portion of the light of the first wavelength $\lambda 1$ may prevent modulation of the AML, thus confining modulation of the AML by the light of the first wavelength $\lambda 1$ to a region within the ring not illuminated by the light of the second wavelength. Modulation of the AML can cause the modulated portion of the AML to become transparent and allow light (i.e., the light of the first wavelength $\lambda 1$) to pass through the AML to expose the photoresist layer 310.

After illumination and modulation of the AML 315, including exposure of the photoresist layer 310, the modulated transparent portion 325 of the AML can be caused or allowed to return to an opaque state. For example, the illumination can be turned off and the AML may be allowed to spontaneously relax to the opaque state. If the AML is bistable, then a uniform illumination of light at the second wavelength $\lambda 2$ may be used to initiate the recovery to the opaque state. In another example, a third wavelength of light, such as infrared light, may be used to illuminate the AML, causing a buildup of heat to facilitate recovery of the AML. Other sources of heat aside from light may also be used such as heat source 545 of FIG. 5.

Figure 3C:
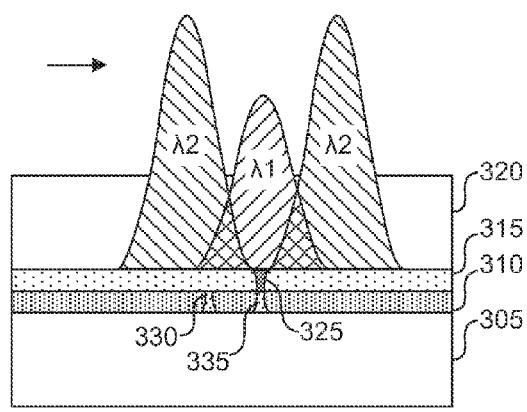

The illumination light of the first and second wavelengths $\lambda 1$, $\lambda 2$ can be moved relative to the sample and repeated as shown in FIG. 3c. Movement of the illumination relative to the sample can be include, for example, moving the light source(s), moving a mirror or other optical device directing the light toward the sample, moving the sample or any other suitable movement. The mask can be moved with the light, optical device or sample, or may remain in a fixed position relative to the sample. In a specific example, the sample and mask can remain in a fixed position relative to one another and in contact with one another during any number of repetitions of the process of modulating the AML 315 and exposing the photoresist 310.

Subsequent repetitions of the process can result in additional latent images 335 being formed in the photoresist layer adjacent to the previous latent image 330. Due to the tightly confining nature of absorbance modulation being implemented, the spacing between these neighboring exposed features or latent images can be significantly smaller than the optical diffraction limit. In other words, nanoscale features may be printed. The process of modulation of the AML 315, exposure of the photoresist 310, restoration or recovery of the AML, stepping of the light source, and so forth can be repeated any number of times to create a full image in the photoresist film. Similar to the operation of dot-matrix printers in which images are printed on paper using closely-spaced dots, any arbitrary image or pattern may be generated in the photoresist by exposure of small dots. Each dot may represent the latent image of a single exposure cycle. In another example, multiple dots and rings can be focused on the mask and sample at a same or similar time and a single exposure cycle may be represented by a set of dots.

Figure 3D:
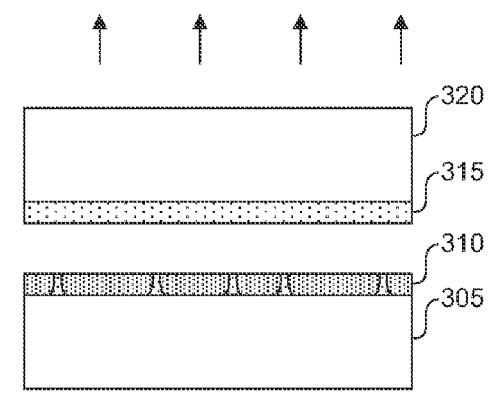

Once the exposures are completed, the programmable photomask may be separated from the sample as indicated in FIG. 3d. Care may be taken to avoid any sticking or transfer of material between the AML 315 and the photoresist 310 during this step. For example, cooling the photomask and sample may assist in avoiding sticking or transfer of material.

Figure 3E:
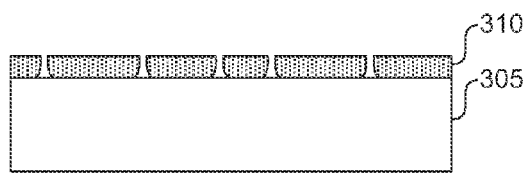

The photoresist layer 310 on the sample can be developed in accordance with conventional photoresist developing techniques. In examples using a positive-tone photoresist, regions that were exposed to $\lambda 1$ (i.e., the location of the latent images 330, 335 in FIG. 3c) may be removed in a solvent or "developer". FIG. 3e illustrates an example of a positive-tone photoresist development. In examples using a negative-tone photoresist, those regions that were exposed to $\lambda 1$ will remain when immersed in a developer and the non-exposed regions will be removed. In either example, a desired pattern of nanoscale features may be created in the photoresist layer. This pattern may subsequently be transferred into any underlying layers (or the substrate) via a variety of pattern-transfer techniques. Some non-limiting example pattern transfer techniques include reactive-ion etching, wet-chemical etching, plasma etching, lift-off and so forth.

As mentioned previously, while a single dot is shown being exposed for each iteration of the process illustrated in FIG. 3, the process may be extended for exposure of multiple dots. For example, diffractive optics or spatial-light modulators may be used to simultaneously form multiple instances of dots and rings of the first and second wavelengths of light.

The illumination for the present programmable contact mask photolithography may be 1-dimensional (1-D). In this example, the AML 315 may illuminated by a 1-D standing wave at wavelength $\lambda 2$, which may be approximately twice the period of a 1-D standing wave at wavelength $\lambda 1$. The standing waves may be in-phase with one another. This configuration may produce an exposure pattern congruent with the shape and position of the waves. In another example, illumination a standing wave or a ring-shaped spot of wavelength $\lambda 2$ may be used along with a uniform illumination of light at wavelength $\lambda 1$.

Figure 4:
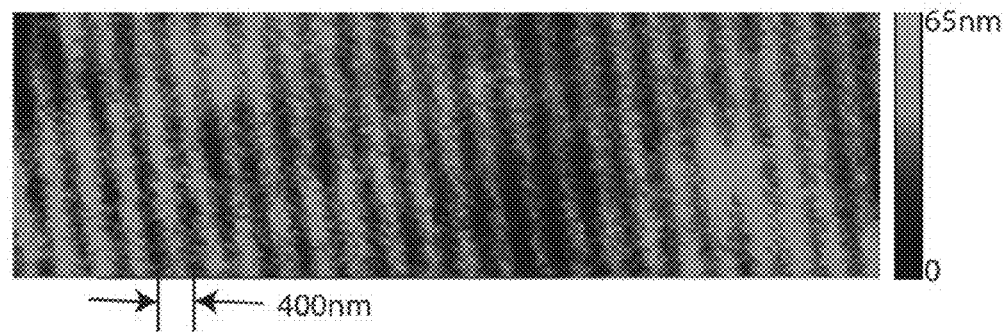
FIG. 4 is an atomic-force micrograph of gratings patterned using programmable photomask lithography in accordance with an example of the present technology.

FIG. 4 is an atomic-force micrograph of a grating pattern in a positive-tone photoresist that was created using programmable-contact mask lithography, where the illumination pattern was comprised of a standing wave in $\lambda 2$ and a uniform illumination in $\lambda 1$. In this example a barrier layer comprised of ~20 nm of poly-vinyl alcohol was used. The illumination wavelengths were $\lambda 2$=647 nm (emitted from a krypton-ion laser light source) and $\lambda 1$=~300 nm (which is the center wavelength of a UV lamp light source). The period of the standing wave at $\lambda 2$ was ~400 nm. The AML was composed of a diarylethene molecule doped in PMMA (polymethylmethacrylate). The AML was spun-cast onto a clean glass slide. The photoresist was a Shipley 1813 commercial material.

A conventional contact mask aligner system may be modified to implement a system for programmable mask contact photolithography. Some example non-limiting systems are described below. However, numerous variations and modifications to the system design and configuration may be made without departing from the principles of the present technology.

In one example implementation, a dichroic beam combiner may be used with the contact mask aligner to allow for the presence of multiple wavelengths of light. Other implementations include the use of polarizing beamsplitters or introduction of the second wavelength at an angle without a light combining optic (such as the beam combiner or beamsplitter). Additionally, at least one of the wavelengths of light may be patterned. For example, wavelength $\lambda 2$ may be patterned by a spatial light modulator or another mask.

Figure 5:
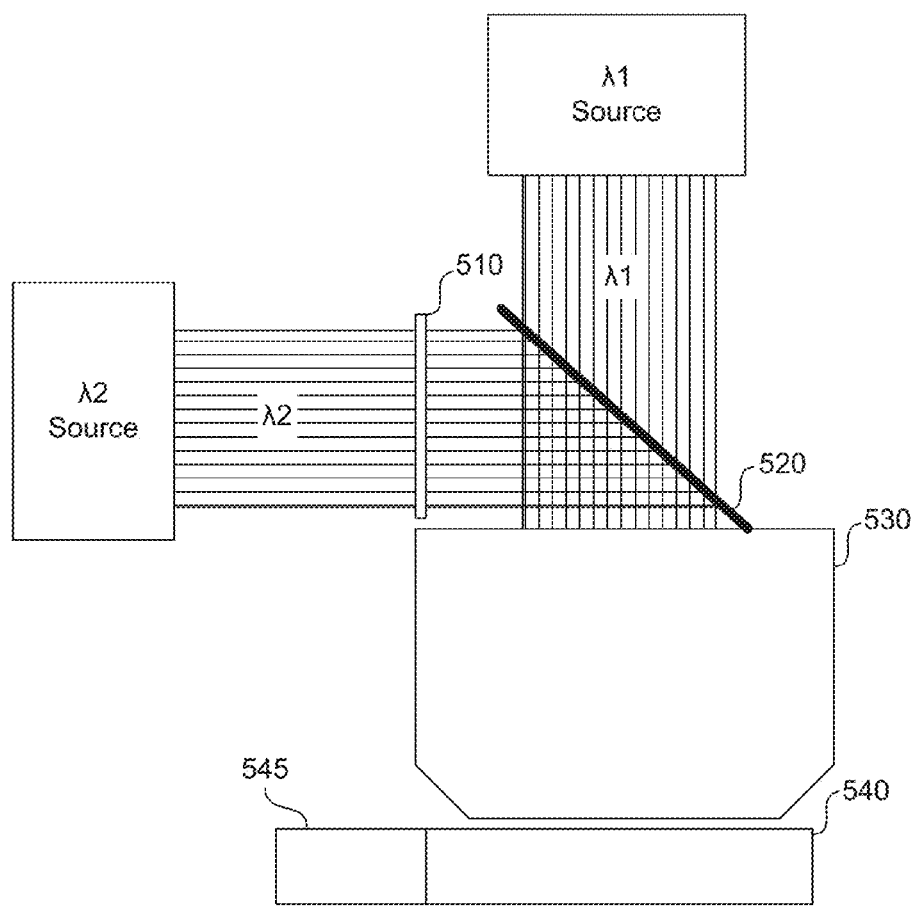
FIG. 5 is a block diagram of a system for programmable contact mask lithography in accordance with an example of the present technology.

FIG. 5 shows a block diagram of a programmable mask contact photolithography in accordance with an example of the present technology. The system of FIG. 5 utilizes a transmissive spatial light modulator (SLM) 510 to pattern the $\lambda 2$ beam of light. The $\lambda 1$ beam of light may remain unpatterned, resulting in a uniform illumination on the programmable mask. The beams of the two wavelengths of light can be combined with a dichroic mirror 520. An imaging system 530, such as a microscope objective for example, may be used to de-magnify the beams onto the programmable photomask/sample 540 for high resolution. The pattern of $\lambda 2$ may be demagnified and projected onto the programmable photomask. The sample can be held in a same manner as the photomask in a contact aligner. The mechanism to bring the programmable photomask in contact with the sample can also be the same as in a conventional mask aligner. For example, a vacuum may be pulled in the gap between the programmable photomask and the sample to bring the mask and the sample into intimate contact. Again, precautions may be taken to avoid dust particles that may obstruct intimate contact. The system of FIG. 5 also utilizes heat source 545 configured to heat an absorbance modulation layer to restore an original state of the absorbance modulation layer before illumination from a first light source.

Figure 6A:
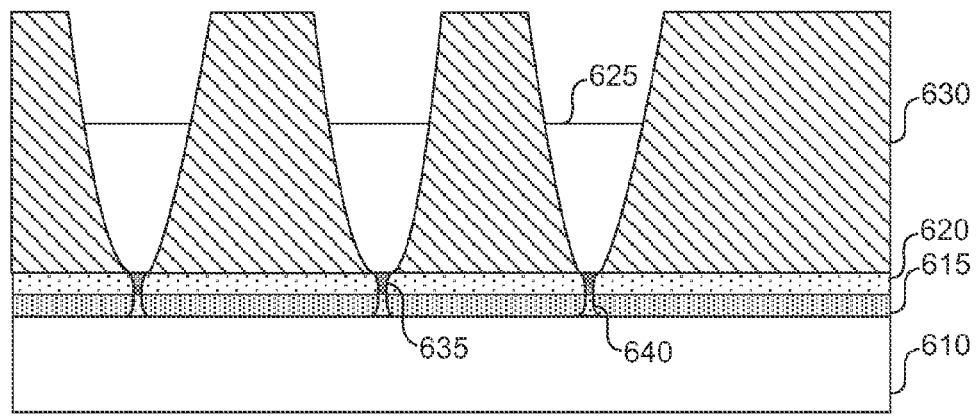
FIGS. 6a-6c illustrate a sequence of exposure frames for creating high-resolution patterns in a photoresist in accordance with an example of the present technology.
Figure 6B:
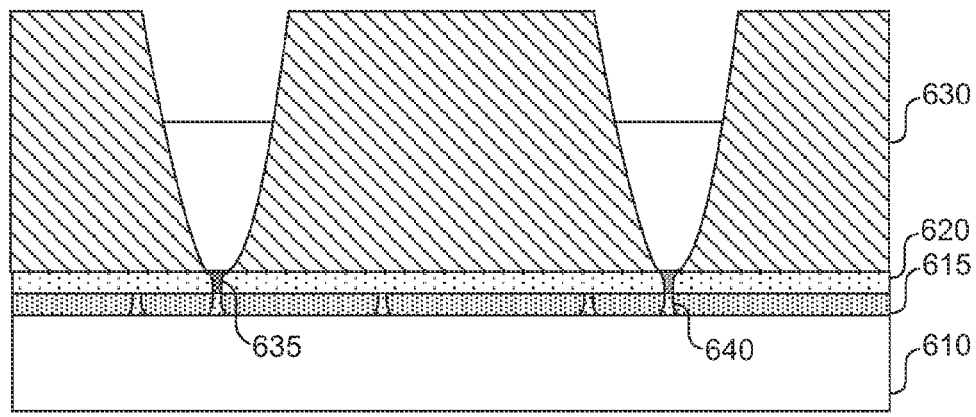
Figure 6C:
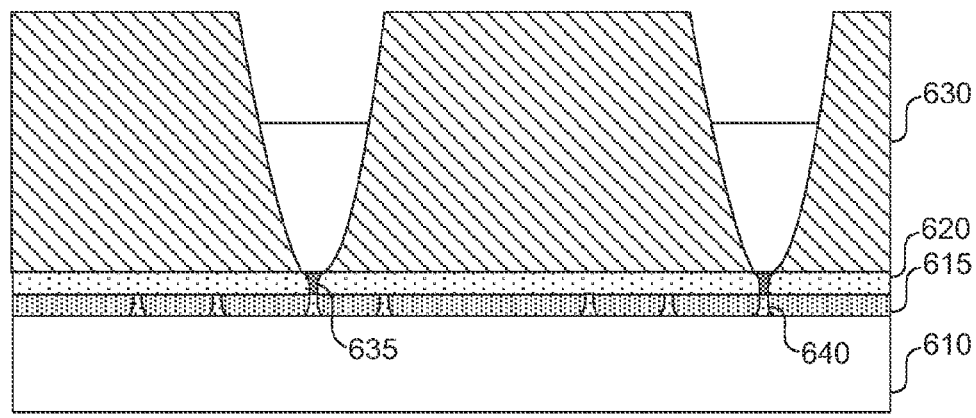

FIGS. 6a-6c illustrate a sequence of three exposures of the photomask respectively. Each exposure is enabled by one frame of the SLM, which patterns the $\lambda 2$ 630 beam with nodes. FIGS. 6a-6c illustrate a cross section of the pattern, which when viewed from a top angle may appear as a series of ring-shaped nodes in the pattern of $\lambda 2$ light. The nodes (illustrated as the parabolic-shaped patterns in the figures) may typically be formed as two-dimensional nodes. However, the nodes may alternately be one-dimensional nodes. The programmable mask may be simultaneously illuminated by the $\lambda 2$ light patterned with a multitude of nodes and also be illuminated by a uniform illumination of light at wavelength $\lambda 1$ ($\lambda 1$ is not specifically shown but is uniformly present where $\lambda 2$ is illustrated and in the nodes formed in $\lambda 2$). The pattern in the $\lambda 2$ light may be created, for example, by amplitude or a phase modulation imparted on the beam by the SLM. The first frame (FIG. 6a) results in latent exposures in the photoresist as indicated. These latent exposures may be spaced apart from one another. Prior to the second frame in FIG. 6b, the AML 620 is allowed to return from a modulated state 635 to the opaque state either by exposure to a uniform illumination at $\lambda 2$ (which may be a pattern imparted by the SLM) or by a spontaneous recovery. The recovery may also be thermally initiated, such as through the use of an infrared illumination directed through the transparent substrate 625 of the mask. As another alternative recovery method, the AML may be exposed to a third wavelength of light, which may be selected to have no affect the photoresist layer 615. It is noted that the light of wavelength $\lambda 2$ may also be selected to have no effect on the photoresist layer. During the recovery step, the $\lambda 1$ light source may be turned off or blocked, such as by placing a shutter over the light source for the $\lambda 1$ light. Once recovery is complete, the second exposure may be performed.

Referring still to FIG. 6b, the second exposure may be used to create a latent image 640 at a close position to one or more of the latent images from the first exposure, where a distance between a latent image of the second exposure and a latent image of the first exposure is smaller than a distance between multiple of the latent images of the first exposure. For example, spacing between formation of latent images in a single exposure may be limited by optical diffraction limits, but such spacing limitations may be overcome to create high resolution patterns through performing multiple exposures where the formation of latent images is spaced by movement of the $\lambda 2$ light relative to the sample. The exposure process may be continued as in frame 3 in FIG. 6c until the desired pattern is created in the photoresist 615 as a latent image pattern represented by a composite of dots or other shapes exposed in the photoresist. After completion of the exposure process, the programmable mask can be removed from contact with the sample to develop the sample.

In some implementations the SLM may be replaced by a conventional photomask. The photomask may have a desired pattern. A separate photomask may be used for each exposure frame in which the pattern for the frame is different for the pattern in another frame. If the pattern in each frame is the same but spatially shifted from a previously frame, the same photomask may be used for multiple exposures by spatially shift the sample or the photomask or both. Thus, a conventional photomask may be used for programmable contact mask photolithography, enabling high resolution imaging at less expense than systems utilizing an SLM.

Figure 7:
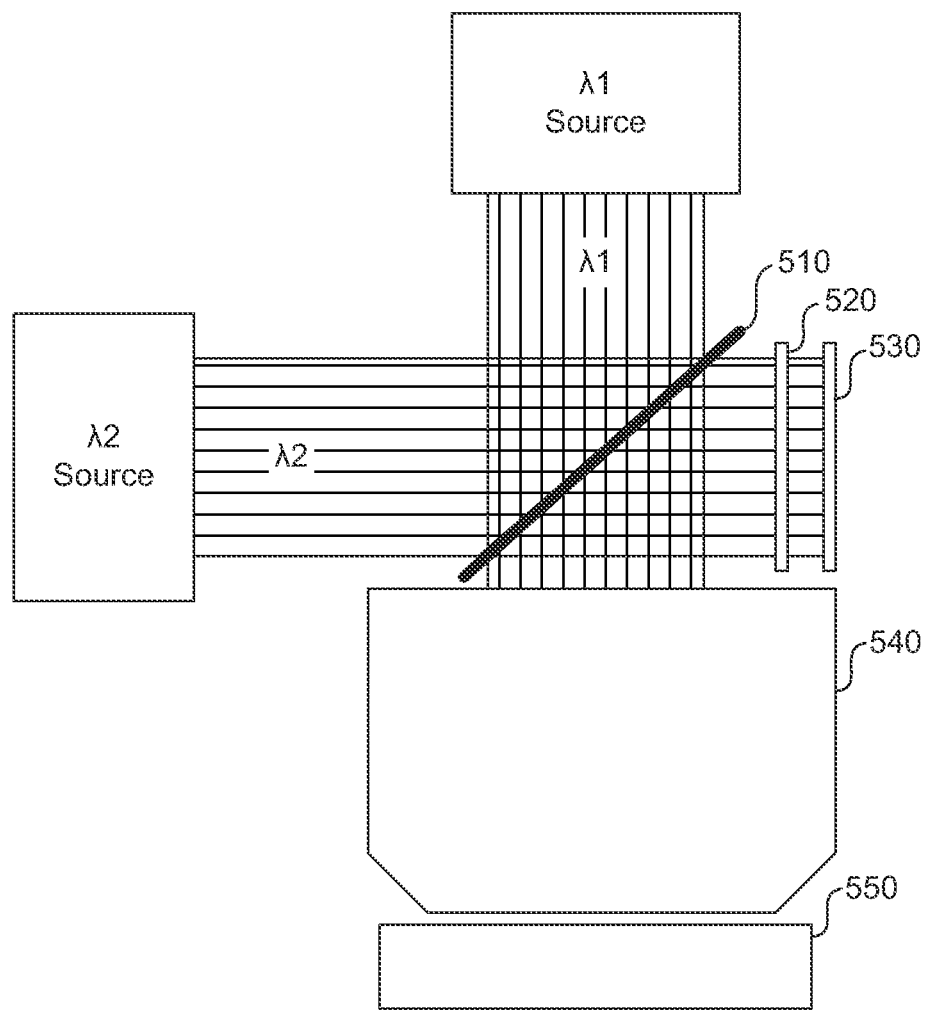
FIG. 7 is a schematic diagram of a system for programmable contact mask lithography using a reflective spatial light modulator in accordance with an example of the present technology.

FIG. 7 illustrates a system for programmable-mask photolithography in accordance with another example of the present technology. In this example, a reflective SLM 530 may be used. Linearly polarized light may be used for illumination at wavelength $\lambda 2$. Light at wavelength $\lambda 1$ may be unpolarized or polarized such that it will transmit through a polarizing beamsplitter 510 to the imaging system 540. The $\lambda 2$ light may be polarized in order to transmit through the polarizing beamsplitter from left to right as shown. A quarter-wave plate retarder 520 may be placed before the reflective SLM and may rotate the polarization of the $\lambda 2$ light. The SLM can impart an amplitude or phase pattern on the beam, which may be reflected back from the SLM toward the $\lambda 2$ light source and may pass through the quarter-wave plate retarder again, resulting in the $\lambda 2$ light being rotated 90° from the original orientation. In other words, the $\lambda 2$ light is an orthogonal polarization to the original polarization. Because of the change in polarization orientation the $\lambda 2$ light is reflected toward the imaging system by the polarizing beamsplitter rather than passing through the beamsplitter as in the original incidence on the beamsplitter. The $\lambda 1$ and $\lambda 2$ light beams may be imaged onto the programmable mask/sample 550 as has been described. The reflective SLM may be more efficient and less expensive in some examples than the transmissive SLM used in the examples described with reference to FIG. 5.

Figure 8:
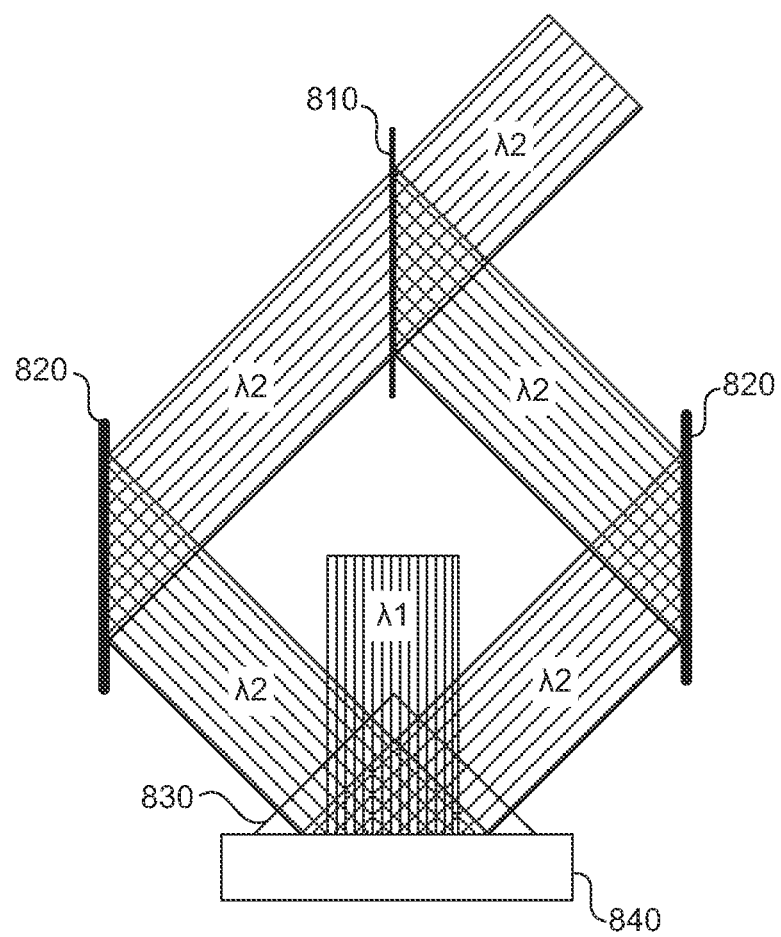
FIG. 8 is a schematic diagram of a system for programmable photolithography using interference in accordance with an example of the present technology.

For creating 1-D patterns or simple 2-D (two-dimensional) patterns, a simpler system may be used, such as the system illustrated in FIG. 8. A two-beam interference of light at wavelength $\lambda 2$ can result in a 1-D standing wave on the surface of the AML in the programmable mask 840. When the 1-D standing wave is combined with a uniform illumination of light at wavelength $\lambda 1$, narrow and/or closely spaced features can be exposed. The nodes in the standing wave may be moved by changing the angle or phase of one or more of the $\lambda 2$ light beams and/or by moving the programmable mask and/or sample relative to the optics (i.e., a 50:50 beamsplitter 810 and mirrors 820).

In this example, a single $\lambda 2$ light beam is split into two light beams using a 50:50 beamsplitter 810. Matched mirrors 820 can be used to redirect and interfere the two light beams at the programmable mask 840. A similar effect may be achieved using a grating-based splitter combiner. Any number of other variations of simple interferometers may also be used, as may be appreciated.

A prism 830 may be positioned over the programmable photomask 840. The prism can provide a high-index medium to reduce the period of the standing wave in λ2. The programmable mask and sample can be rotated relative to the optics in order to produce simple 2-D geometries. Interference of more than two λ2 beams may enable creation of more complex geometries.

Figure 9:
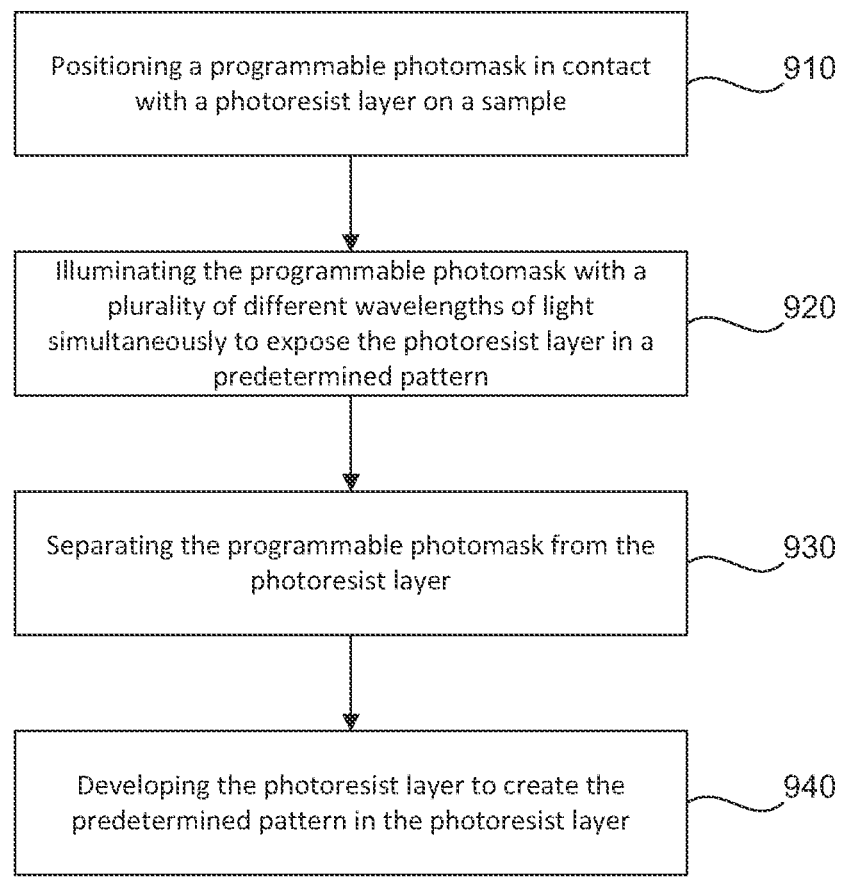
FIGS. 9-10 are flow diagrams of methods of programmable photolithography in accordance with examples of the present technology.

Referring to FIG. 9, a flow diagram of a method for performing programmable photolithography is illustrated in accordance with an example of the present technology. The method can include positioning 910 a programmable photomask in contact with a photoresist layer on a sample. The programmable photomask can be illuminated 920 with a plurality of different wavelengths of light simultaneously to expose the photoresist layer in a predetermined pattern. The programmable photomask can be separated 930 from the photoresist layer and the photoresist layer can be developed 940 to create the predetermined pattern in the photoresist layer.

After a pattern has been formed on the substrate using imprint or transfer methods as described above, an etching process can be used to etch within the pattern to create features in the substrate. In other words, the pattern can form a mask to enable etching of the substrate, as is known in the art. For example, various deposition, etching, and/or lithography techniques may be used after the pattern/topography is created on the substrate. As specific and non-limiting examples of fabrication methods, various metals, dielectric, and other layers can be deposited using sputtering or evaporation processes, physical vapor deposition, chemical vapor deposition, electrochemical deposition, molecular beam epitaxy, and/or atomic layer deposition.

The method can include forming the layers comprising the AML, photoresist, barrier, and/or any other layers, such as through deposition using the above-described process or other processes such as, but not limited to, chemical vapor deposition, atomic layer deposition, physical vapor deposition, and the like.

Programmable contact mask photolithography may be used to form multiple patterned layers or substrates, which may be formed of varying materials so as to produce specific devices (i.e. OLEDs, integrated circuits, micro- or nano-electromechanical systems, solar cells, DNA micro-arrays, nanophotonic devices, microphotonic devices, integrated optics, plasmonics, metamaterials, and so forth.).

A variety of semiconductor materials are contemplated for use as sample substrates with the devices and methods according to aspects of the present disclosure. Non-limiting examples of such semiconductor materials can include group IV materials, compounds and alloys comprised of materials from groups II and VI, compounds and alloys comprised of materials from groups III and V, and combinations thereof. More specifically, exemplary group IV materials can include silicon, carbon (e.g. diamond), germanium, and combinations thereof. Various exemplary combinations of group IV materials can include silicon carbide (SiC) and silicon germanium (SiGe). In one specific aspect, the semiconductor material can be or include silicon. Exemplary silicon materials can include amorphous silicon (a-Si), microcrystalline silicon, multicrystalline silicon, and monocrystalline silicon, as well as other crystal types. In another aspect, the semiconductor material can include at least one of silicon, carbon, germanium, aluminum nitride, gallium nitride, indium gallium arsenide, aluminum gallium arsenide, and combinations thereof.

Exemplary combinations of group II-VI materials can include cadmium selenide (CdSe), cadmium sulfide (CdS), cadmium telluride (CdTe), zinc oxide (ZnO), zinc selenide (ZnSe), zinc sulfide (ZnS), zinc telluride (ZnTe), cadmium zinc telluride (CdZnTe, CZT), mercury cadmium telluride (HgCdTe), mercury zinc telluride (HgZnTe), mercury zinc selenide (HgZnSe), and combinations thereof.

Exemplary combinations of group III-V materials can include aluminum antimonide (AlSb), aluminum arsenide (AlAs), aluminum nitride (AN), aluminum phosphide (AlP), boron nitride (BN), boron phosphide (BP), boron arsenide (BAs), gallium antimonide (GaSb), gallium arsenide (GaAs), gallium nitride (GaN), gallium phosphide (GaP), indium antimonide (InSb), indium arsenide (InAs), indium nitride (InN), indium phosphide (InP), aluminum gallium arsenide (AlGaAs, $Al_xGa_{1-x}As$), indium gallium arsenide (InGaAs, InxGa1-xAs), indium gallium phosphide (InGaP), aluminum indium arsenide (AlInAs), aluminum indium antimonide (AlInSb), gallium arsenide nitride (GaAsN), gallium arsenide phosphide (GaAsP), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide antimonide (GaInNAsSb), gallium indium arsenide antimonide phosphide (GaInAsSbP), and combinations thereof.

Additionally, various types of semiconductor materials are contemplated, and any such material that can be used for the particular device design is considered to be within the present scope. In one aspect, for example, the semiconductor material is monocrystalline. In another aspect, the semiconductor material is multicrystalline. In yet another aspect, the semiconductor material is microcrystalline. It is also contemplated that the semiconductor material can be amorphous. Specific non-limiting examples include amorphous silicon or amorphous selenium.

The semiconductor materials of the present disclosure can also be made using a variety of manufacturing processes. In some cases the manufacturing procedures can affect the efficiency of the device, and can be taken into account in achieving a desired result. Exemplary manufacturing processes can include Czochralski (Cz) processes, magnetic Czochralski (mCz) processes, Float Zone (FZ) processes, epitaxial growth or deposition processes, and the like. It is contemplated that the semiconductor materials used in the present invention can be a combination of monocrystalline material with epitaxially grown layers formed thereon.

Figure 10:
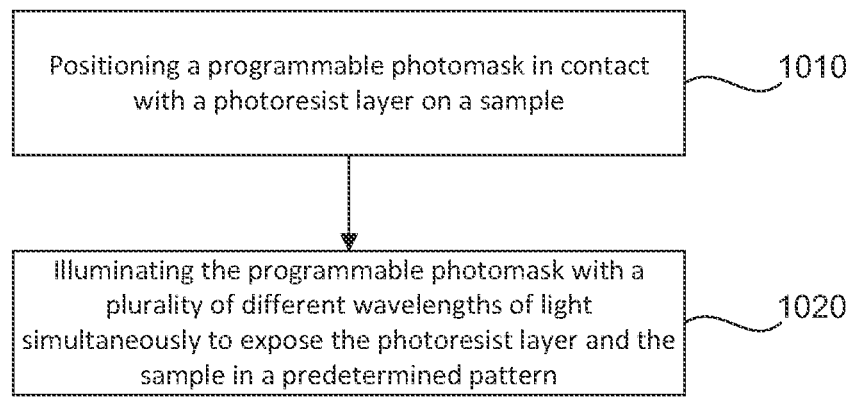

Referring to FIG. 10, a flow diagram of a method for performing programmable photolithography is illustrated in accordance with another example of the present technology. The method can include positioning 1010 a programmable photomask in contact with or in proximity to a photoresist layer on a sample. The programmable photomask can be illuminated 1020 with a plurality of different wavelengths of light simultaneously to expose the photoresist layer in a predetermined pattern.

The method can include recovery of the programmable photomask and may be a repetitive process of programming and recovering the programmable photomask to expose a desired pattern in the photoresist layer. The photomask can be recovered by transitioning the AML material across the mask to a common absorption state. For example, the entire photomask can be exposed to a uniform light source such that the entire mask becomes opaque or transparent (or translucent). Alternatively, the photomask can be heated to transition AML materials to a common state. The repetitive process may enable closer latent image spacing than is otherwise allowed by the optical diffraction limit and/or than is present in the pattern imparted on the incident light by an SLM, mask, or other pattern-imparting device. With conventional far-field optics, the smallest structures would be limited by diffraction to about half the wavelength of light used. Thus, for example, for 400 nm wavelength, the smallest structure that may be created with conventional far-field optics may be about 200 nm. With near-field optics, the same limitations are not applicable and structures may be made as small as 10 nm, for example. With absorbance modulation, the resolution may be virtually unlimited (see also U.S. Pat. Nos. 7,666,580; 7,667,819; 7,713,684; and 7,714,988 which are each incorporated herein by reference). The size of the features or structure of the features may be limited according to the size of the beam used to induce the features.

AMOL (absorbance modulation optical lithography) can thus be used to create sub-diffraction limited patterns in the photoresist layer without the use of a rigid mask. This can overcome some of the obstacles encountered in earlier photolithography systems, such as involving redesigning and manufacturing photomasks or considerations for the tight control of spatial distances for conventional near-field imaging. These advantages provide a useful technique to access the non-diffraction limited near-field using far-field optics and provide improved resolution capabilities in photolithography. Also, the maskless nature of AMOL can allow for rapid prototyping of circuit designs by avoiding the time and expense incurred in surface patterning of masks according to earlier technologies.

Figure 11:
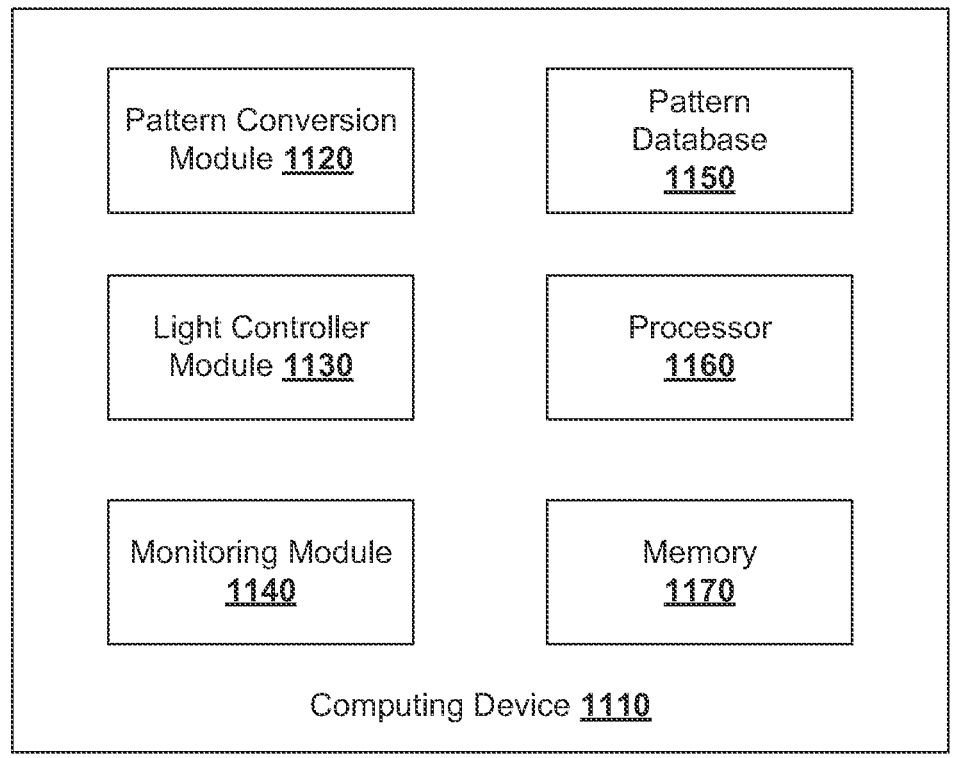
FIG. 11 is a block diagram of a computer-implemented system for use with programmable photolithography in accordance with an example of the present technology

Referring to FIG. 11, a computer-implemented system for use with programmable contact mask photolithography is illustrated in accordance with an example of the present technology. A computing device 1110 can include a processor 1160 and a memory 1170 for executing and storing computer readable instructions. The computer readable instructions may include code configured to operate, for example, as a pattern conversion module 1120, a light controller module 1130, or a monitoring module 1140. The system can include a pattern database 1150 for storing patterns to be created using programmable contact mask photolithography.

Lithography designs may be created based on an intended result and may not necessarily be configured for application in a "dot matrix" style lithography process. Design patterns may be stored in the pattern database 1150 and may be accessed by the pattern conversion module 1120. The pattern conversion module may interpret the stored design patterns and convert the patterns into instructions configured for exposing the desired pattern in a photoresist layer one or more dots at a time. The instructions can be used by the light controller module 1130 to turn the light sources on and off, to move the light sources relative to the programmable mask, or to operate the SLM. The monitoring module 1140 can monitor the progress of creation of the pattern in the photoresist layer and can provide reports to a user via a display device in communication with the computing device 1110.

Various applications may be stored in the memory device 1170 and may be executable by the processor(s) 1160. Components or modules discussed in this description that may be implemented in the form of software using high programming level languages that are compiled, interpreted or executed using a hybrid of the methods.

The computing device 1110 may also have access to I/O (input/output) devices that are usable by the computing devices. An example of an I/O device is a display screen that is available to display output from the computing devices. Other known I/O device may be used with the computing device as desired. Networking devices and similar communication devices may be included in the computing device 1110. The networking devices may be wired or wireless networking devices that connect to the internet, a LAN, WAN, or other computing network.

The components or modules that are shown may be stored in the memory device 1170 and may be executed by the processor 1160. The term "executable" may mean a program file that is in a form that may be executed by a processor. For example, a program in a higher level language may be compiled into machine code in a format that may be loaded into a random access portion of the memory device and executed by the processor, or source code may be loaded by another executable program and interpreted to generate instructions in a random access portion of the memory to be executed by a processor. The executable program may be stored in any portion or component of the memory device. For example, the memory device may be random access memory (RAM), read only memory (ROM), flash memory, a solid state drive, memory card, a hard drive, optical disk, floppy disk, magnetic tape, or any other memory components.

The processor 1160 may represent multiple processors and the memory 1170 may represent multiple memory units that operate in parallel to the processing circuits. This may provide parallel processing channels for the processes and data in the system. The local interface may be used as a network to facilitate communication between any of the multiple processors and multiple memories. The local interface may use additional systems designed for coordinating communication such as load balancing, bulk data transfer, and similar systems.

While the flowcharts presented for this technology may imply a specific order of execution, the order of execution may differ from what is illustrated. For example, the order of two more blocks may be rearranged relative to the order shown. Further, two or more blocks shown in succession may be executed in parallel or with partial parallelization. In some configurations, one or more blocks shown in the flow chart may be omitted or skipped. Any number of counters, state variables, warning semaphores, or messages might be added to the logical flow for purposes of enhanced utility, accounting, performance, measurement, troubleshooting or for similar reasons.

Some of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more blocks of computer instructions, which may be organized as an object, procedure, or function. Nevertheless, the executables of an identified module need not be physically located together, but may comprise disparate instructions stored in different locations which comprise the module and achieve the stated purpose for the module when joined logically together.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices. The modules may be passive or active, including agents operable to perform desired functions.

The technology described here may also be stored on a computer readable storage medium that includes volatile and non-volatile, removable and non-removable media implemented with any technology for the storage of information such as computer readable instructions, data structures, program modules, or other data. Computer readable storage media include, but is not limited to, RAM, ROM, EEPROM, flash memory or other memory technology, CD-ROM, digital versatile disks (DVD) or other optical storage, magnetic cassettes, magnetic tapes, magnetic disk storage or other magnetic storage devices, or any other computer storage medium which may be used to store the desired information and described technology. As used herein, the terms "medium" and "media" may be interchangeable with no intended distinction of singular or plural application unless otherwise explicitly stated. Thus, the terms "medium" and "media" may each connote singular and plural application.

The devices described herein may also contain communication connections or networking apparatus and networking connections that allow the devices to communicate with other devices. Communication connections are an example of communication media. Communication media typically embodies computer readable instructions, data structures, program modules and other data in a modulated data signal such as a carrier wave or other transport mechanism and includes any information delivery media. A "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency, infrared, and other wireless media. The term computer readable media as used herein includes communication media.

Reference was made to the examples illustrated in the drawings, and specific language was used herein to describe the same. It will nevertheless be understood that no limitation of the scope of the technology is thereby intended. Alterations and further modifications of the features illustrated herein, and additional applications of the examples as illustrated herein, which would occur to one skilled in the relevant art and having possession of this disclosure, are to be considered within the scope of the description.

Furthermore, the described features, structures, or characteristics may be combined in any suitable manner in one or more examples. In the preceding description, numerous specific details were provided, such as examples of various configurations to provide a thorough understanding of examples of the described technology. One skilled in the relevant art will recognize, however, that the technology may be practiced without one or more of the specific details, or with other methods, components, devices, etc. In other instances, well-known structures or operations are not shown or described in detail to avoid obscuring aspects of the technology.

While the forgoing examples are illustrative of the principles of the present technology in one or more particular applications, it will be apparent to those of ordinary skill in the art that numerous modifications in form, usage and details of implementation can be made without the exercise of inventive faculty, and without departing from the principles and concepts of the technology. Accordingly, it is not intended that the technology be limited, except as by the claims set forth below.

What is claimed is:

1. A method of programmable photolithography, comprising:
    positioning a programmable contact photomask in proximity to a photoresist layer on a sample;
    illuminating the programmable contact photomask with a plurality of different wavelengths of light simultaneously to expose the photoresist layer in a predetermined pattern;
    separating the programmable contact photomask from the photoresist layer wherein the separating the programmable contact photomask allows for repeated reuse of the programmable contact photomask; and
    developing the photoresist layer to create the predetermined pattern in the photoresist layer.

2. The method of claim 1, further comprising moving the programmable contact photomask and the sample relative to one another, and illuminating the programmable contact photomask with the plurality of different wavelengths of light.

3. The method of claim 1, further comprising ceasing to illuminate the programmable contact photomask with the plurality of different wavelengths of light for a predetermined period of time to allow the programmable contact photomask to return to a pre-illumination state.

4. The method of claim 1, further comprising illuminating the programmable contact photomask with an individual of the plurality of different wavelengths of light to restore the programmable contact photomask to a pre-illumination state.

5. The method of claim 1, wherein the programmable contact photomask comprises an absorbance modulation layer configured to change opacity when illuminated by one of the plurality of different wavelengths of light.

6. The method of claim 5, wherein the absorbance modulation layer is a bistable absorbance modulation layer configured to return to or maintain an original opacity when illuminated by another one of the plurality of different wavelengths of light.

7. The method of claim 5, wherein the programmable contact photomask further includes a transparent mask substrate, which is transparent to the plurality of different wavelengths of light.

8. The method of claim 1, further comprising redirecting the plurality of different wavelengths of light to a different position on the contact photomask photomask.

9. The method of claim 1, wherein the step of illuminating further comprises overlapping the plurality of different wavelengths of light and wherein the predetermined pattern is exposed at a portion of the programmable contact photomask illuminated by one of the plurality of different wavelengths of light in a region of non-overlap by another of the plurality of different wavelengths of light.

10. The method of claim 1, wherein the predetermined pattern comprises a dot shape and the step of illuminating the programmable contact photomask with the plurality of different wavelengths of light comprises illuminating the programmable contact photomask with a ring-shaped pattern of one of the plurality of different wavelengths of light.

11. The method of claim 1, wherein the developing the photoresist layer to create the predetermined pattern further comprises alternately and repeatedly exposing the photoresist layer and recovering and reprogramming the programmable contact photomask.

12. A programmable photolithography system, comprising:
a sample stage configured to support a sample;
a programmable contact photomask comprising an absorbance modulation layer supported over the sample stage wherein the programmable contact photomask allows for repeated reuse of the programmable contact photomask;
a first light source configured to direct light of a first wavelength toward the absorbance modulation layer; and
a second light source configured to direct light of a second wavelength toward the absorbance modulation layer simultaneously with the first wavelength of light from the first light source.

13. The system of claim 12, further comprising a transmissive spatial light modulator in a path of the light from the second light source configured to pattern the light from the second light source.

14. The system of claim 13, wherein the light from the first light source is unpatterned.

15. The system of claim 12, further comprising a dichroic beam combiner for combining the first and second wavelengths of light.

16. The system of claim 12, wherein the absorbance modulation layer is supported by a transparent mask substrate, which is transparent to the first and second wavelength of light.

17. The system of claim 12, wherein the light from the second light source is directed toward the absorbance modulation layer at an angle relative to a direction at which the light from the first light source is directed toward the absorbance modulation layer.

18. The system of claim 12, further comprising a heat source configured to heat the absorbance modulation layer to restore an original state of the absorbance modulation layer before illumination from the first light source.

19. A method of programmable photolithography, comprising:
positioning a programmable contact photomask in contact with a photoresist layer on a sample;
illuminating the programmable contact photomask with a plurality of different wavelengths of light simultaneously to expose the photoresist layer and the sample in a predetermined pattern, said photomask including a transparent mask substrate supporting an absorbance modulation layer configured to change opacity when illuminated by at least one of the plurality of different wavelengths of light; and
separating the programmable contact photomask from the photoresist layer wherein the separating the programmable contact photomask allows for repeated reuse of the programmable contact photomask.

20. The method of claim 19, further comprising:
restoring the programmable contact photomask to a pre-illumination state after the separating the programmable contact photomask; and
developing the photoresist layer to create the predetermined pattern in the photoresist layer.

* * * * *